United States Patent [19]
Buehler et al.

[11] Patent Number: 5,048,023
[45] Date of Patent: Sep. 10, 1991

[54] ASYMMETRIC SOFT-ERROR RESISTANT MEMORY

[75] Inventors: Martin G. Buehler, La Canada; Marvin Perlman, Granada Hills, both of Calif.

[73] Assignee: The United States of America as represented by the Administrator, National Aeronautics and Space Administration, Washington, D.C.

[21] Appl. No.: 311,024

[22] Filed: Feb. 16, 1989

[51] Int. Cl.$^5$ .................... G11C 29/00; H03M 13/00
[52] U.S. Cl. .................................. 371/40.1; 365/156; 365/200
[58] Field of Search ............... 371/40.1, 37.1, 51.1, 371/37.3; 365/154, 156, 200

[56] References Cited

U.S. PATENT DOCUMENTS

| | | | |
|---|---|---|---|
| 3,493,786 | 2/1970 | Ahrons et al. | |
| 4,063,225 | 12/1977 | Stewart | 365/156 |
| 4,404,657 | 9/1983 | Furuyama et al. | 365/154 |
| 4,535,426 | 8/1985 | Ariizumi et al. | 365/182 |
| 4,590,085 | 5/1986 | Hirakawa et al. | 357/41 |
| 4,641,165 | 2/1987 | Iizuka et al. | 357/23.6 |
| 4,706,107 | 11/1987 | Terada et al. | 357/23.5 |

OTHER PUBLICATIONS

Lombardi, T. et al., "Megarad Radiation-Hardened Array Design for Fault-Tolerant Spaceborne Computer", Proc. IEEE Intl. Conf. on Circuits and Computers, 1980, pp. 324-328.

Constantin, S. et al., "On the Theory of Binary Asymmetric Error Correcting Codes", Information and Control, vol. 40, 1979, pp. 20-36.

Cohen, L. et al., "Single-Transistor Cell Makes Room for More Memory on an MOS Chip", Electronics, Aug. 2, 1971, pp. 69-75.

"Basics of Error Detection and Correction", EDN, Mar. 4, 1981, p. 34.

Rao, T. et al., Error Control Coding for Computer Systems, Prentice-Hall, 1989, pp. 350-357, 385-388.

Primary Examiner—Stephen M. Baker
Attorney, Agent, or Firm—Thomas H. Jones; Harold W. Adams; John R. Manning

[57] ABSTRACT

A memory system is provided, of the type which includes an error-correcting circuit that detects and corrects errors, which more efficiently utilizes the capacity of a memory formed of groups of binary cells whose states can be inadvertently switched by ionizing radiation. Each memory cell has an asymmetric geometry, so that ionizing radiation causes a significantly greater probability of errors in one state than in the opposite state (e.g., an erroneous switch from "1" to "0" is far more likely than a switch from "0" to "1"). An asymmetric error-correcting coding circuit can be used with the asymmetric memory cells, which requires fewer bits than an efficient symmetric error-correcting code.

3 Claims, 1 Drawing Sheet

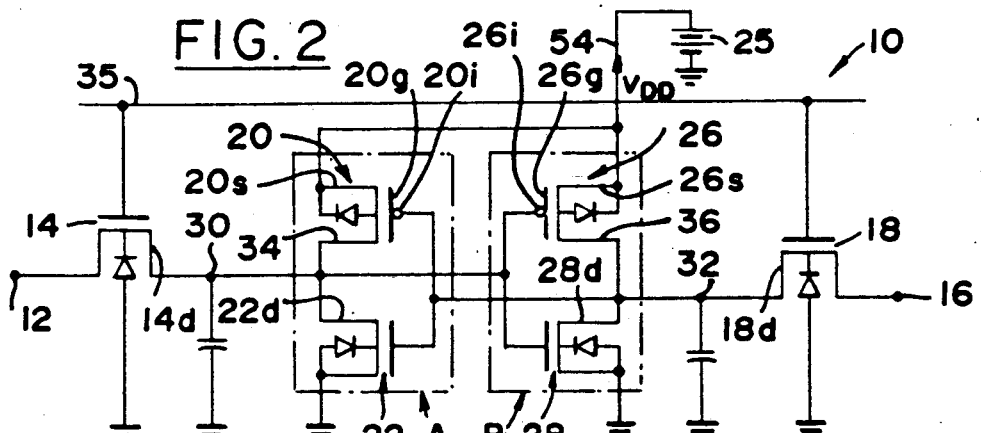
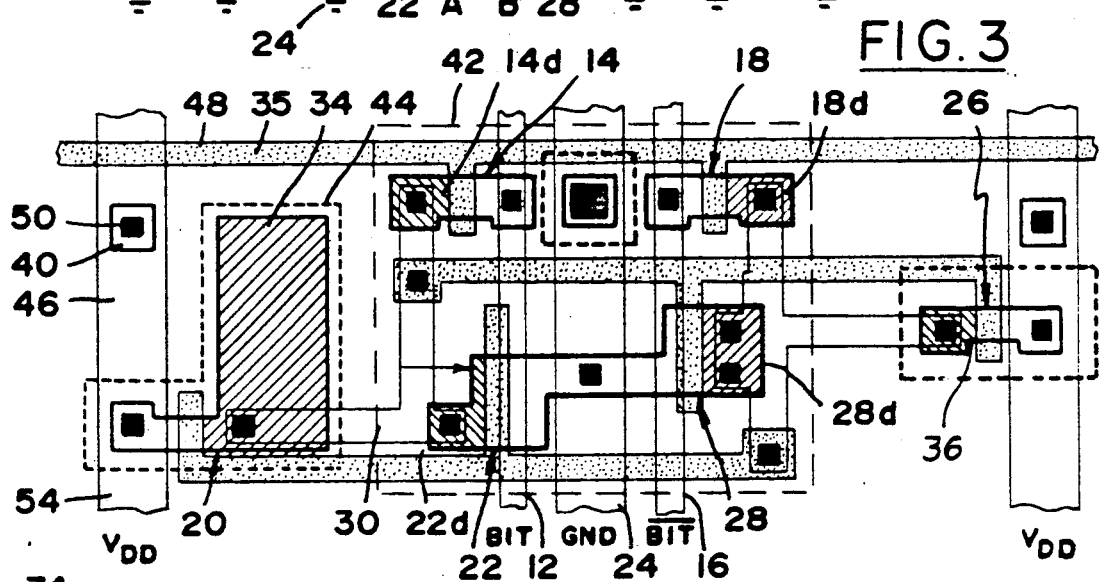
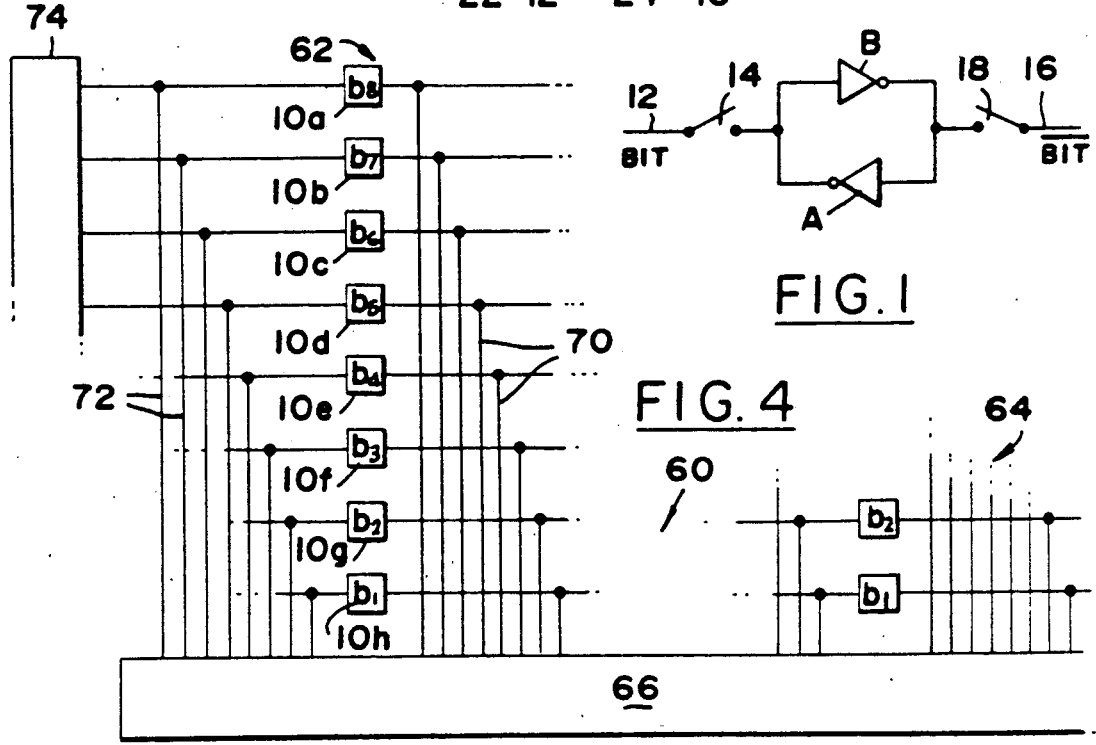

ASYMMETRIC SOFT-ERROR RESISTANT MEMORY

ORIGIN OF THE INVENTION

The invention described herein was made in the performance of work under a NASA contract, and is subject to the provisions of Public Law 96-517 (35 (USC 202) in which the Contractor has elected not to retain title.

TECHNICAL FIELD

This invention relates to transistor-based binary memory cells, and to an error-correcting memory system using such cells.

BACKGROUND OF THE INVENTION

When certain binary memory cells are struck by ionizing radiation, they may exhibit "soft" errors which change the state of the cell without affecting its capacity to later reliably receive and store binary information. However, such "soft" errors corrupt the data stored in memory. To avoid erroneous data, circuitry external to the memory circuitry is commonly provided, which detects and corrects errors as by detecting which one of the several bits of a byte or word is in error and by substituting the correct bit for the erroneous one. Of course, additional bits are required in each word in order to correct an error. The ratio of information bits in each word to the total number of bits in the word represents the "information rate" of the system.

One example of a memory subject to soft errors is an interplanetary space probe which must sometimes make autonomous decisions based on programs stored in its memory. The memory in such space probes is subject to soft errors caused by cosmic radiation. In order to reduce the amount of memory and power consumption of the spacecraft, it is desirable to provide a maximum information rate, that is, to provide a memory system wherein a maximum percentage of the memory is devoted to information and a minimum to redundancy for error correction, while still providing a high degree of error correcting capability.

There are two classes of semiconductor RAMs (random-access-memories), these being static (S) and dynamic (D) types. DRAMs are easily upset by cosmic rays, and are therefore unsuitable for space flight. SRAMs are more suitable. Commercial SRAMs are designed with balanced memory cells. That is, the memory cells are equally likely to change from a first state to a second state, as from a second state to a first state, when subjected to radiation that can cause soft errors. If the SRAM cells could be unbalanced, then the error rate would be greater for a first to a second state than for a second to a first state. If such asymmetry were used to increase the information rate (ratio of information bits to total bits in an error correcting memory system), it would provide more efficient memory systems.

STATEMENT OF THE INVENTION

In accordance with one embodiment of the present invention, a memory system is provided, which includes groups of asymmetric memory cells forming code vectors (encoded words or bytes) and circuitry for correcting errors in the code vectors, which provides a high information rate. Each memory cell is asymmetric in that it is much more likely to be erroneously switched from a first state to a second state (e.g., from "1" to "0" when hit by cosmic radiation) than vice-versa. The error correcting circuitry is based on an asymmetric error correcting code which is more sensitive to the presence of an erroneous cell in the second state than to an erroneous cell in the first state. The combination of asymmetric binary memory cells and an asymmetric error correcting code, results in a higher information rate than for the best comparable symmetric error correcting code.

The novel features of the invention are set forth with particularity in the appended claims. The invention will be best understood from the following description when read in conjunction with the accompanying drawings.

BRIEF DESCRIPTION OF THE DRAWINGS

FIG. 1 is a simplified schematic diagram of a binary memory cell of the type used in random access memories (RAM).

FIG. 2 a more detailed schematic view of the memory cell of FIG. 1.

FIG. 3 is a plan view of the memory cell of FIG. 2.

FIG. 4 is a block diagram of a memory system which includes memory cells of the type shown in FIGS. 1-3.

DETAILED DESCRIPTION OF THE INVENTION

FIG. 1 is a diagram, in logic symbolism, of a memory cells 10 which stores a single bit ("1" or "0"). The cell includes inverters A, B connected in a feedback loop, a pair of input/output ports 12 and 14 connected through gates or switches 14 and 18 to deliver signals that can change the state of the cell or read its state. FIG. 2 is a more detailed view, in schematic notation, showing a 6-transistor memory cell embodiment of the cell of FIG. 1. Inverter A includes pullup transistor 20 and pulldown transistor 22 connected between a voltage supply or source $V_{DD}$ (e.g., 5 volts) and ground 24 (the voltage source is also represented at 25 with 5 volt and ground terminals). The other inverter B includes comparable transistors 26, 28. Each transistor includes a source 20s, 26s, a gate 20g, 26g, a gate inverter 20i, 26, i and a drain 34, 36. In a "1" state of the memory cell, node 30 is low (0 volts) while the node 32 is high (e.g., 5 volts). In the "0" state of the memory cell the voltages at the node 30, 32 are reversed. A switch conductor 35 can carry a voltage pulse to briefly turn on the switches 14, 18, as at predetermined intervals controlled by a clock connected to conductor 35.

In the "1" state of the memory cell of FIG. 2, with node 30 "low" (0 volts) and node 32 "high" (5 volts), transistor 26 is "on," transistor 28 is "off," transistor 20 is "off," and transfer 22 is "on." With the cell in such a state, if the drain 34 of the "off" transistor 20 is struck by ionizing radiation with sufficient linear energy transfer, the drain will be short circuited and will connect $V_{DD}$ to the node 30 to change node 30 from "low" to "high". This will switch all four transistors and thereby change the state of the cell from "1" to "0". The state of the cell can also be flipped if radiation strikes the drain 28d of the "off" transistor 28 or the drain 18d of transistor 18. If the radiation strikes any other parts of the other three transistors 14, 22, 26, this will not result in a change of state of the cell. If the memory cell is in a "0" state, then ionizing radiation of sufficient linear energy transfer striking the drain 36 of transistor 26, or the drain 22d of transistor 22, or the drain 14d of transistor 14, will cause the memory cell to switch from "0" (i.e., the node 32 is low) to a "1" state.

The cell 10 is not symmetric, in that for a given ionizing radiation background, the cell is more likely to change from a "1" state to a "0" state than vice-versa. Applicant does not try to construct the memory so the error probability is symmetric, but instead greatly emphasizes the asymmetry. This is accomplished basically by making the drain 34 of one pullup transistor 20 so it is much larger than the drain 36 of the other pullup transistor 26 of the memory cell. As a result, there is a much greater likelihood that the drain 34 will be hit by cosmic radiation and consequently change the state of the cell from "1" to "0", than is the likelihood that the drain 36 will be hit by cosmic radiation to change the cell from "0" to "1". While the larger size of drain 34 increases the chances of it being hit by cosmic radiation, the larger size of the drain 34 increases the capacitance at the drain 34, so it is more resistant to change, and therefore it requires cosmic rays with higher linear energy transfer to "short circuit" drain 34 than for a smaller drain. With the drain 34 being much larger than the drain 34, the cosmic radiation hitting drain 36 is unlikely to change the state of the cell, because the high capacitance of the large drain 34 resists such change, and the small current flow through the shorted drain 36 is unlikely to overcome the capacitance of drain 34 to change the state of the cell unless the cosmic radiation hitting the small drain 36 is of very high linear energy transfer. Thus, by making the drain 34 of one of the pullup transistors 20 much larger than the drain 36 of the other pullup transistor 26, applicant makes the memory cell very asymmetric, in that the likelihood of inadvertent switching by cosmic radiation from "1" to "0" is much more likely than the reverse switching.

The asymmetry of the memory cell can be achieved by several other approaches in addition to the drain bloating described above. For example, the channel resistances of transistors 20, 22, 24 and 28 can be asymmetric; offset voltages can be introduced into the memory cell, particularly at the source of transistor 22; and feedback resistors and capacitors can be added along the lines shown in FIG. 1.

Applicant finds that combining the asymmetric memory cell 10 with an asymmetric error correcting code results in very efficient information storage. Table 1 includes a column i containing thirty-two numbers in base 10 notation, while column $D_i$ lists corresponding numbers or information vectors in base 2 notation. Column $C_i$ lists thirty-two corresponding code vectors, or correct codewords, of a group theoretic code, which is an asymmetric error-correcting code that can correct any word where there is a single error in which a "1" has erroneously been changed to "0".

It can be seen in Table 1 under $D_i$ that it requires five bits to represent each of thirty-two information words. The code $C_i$ requires three additional bits in each word, or a total of eight bits to represent each of thirty-two different code words or codevectors, with a capability of correcting for any erroneous change of a "1" to a "0". Column $V_i$ represents a linear code which can represent thirty-two different words, and which can correct for a single erroneous change of a "1" to "0" or a single erroneous change of a "0" to a "1". It can be seen that it requires nine bits in each word to provide symmetric error correcting, that is, to correct for transition errors of "0" to "1" or "1" to "0" which are equally probable. In other words, symmetric error correcting requires one additional bit per word as compared to the asymmetric error correcting code. (It is noted that in $V_i$, the first five bits $b_8$-$b_4$ are the came as for $D_i$ for the same numbers.)

TABLE I

| | $D_i$ | | | | | $C_i$ | | | | | | | | $V_i$ | | | | | | | |
|---|---|---|---|---|---|---|---|---|---|---|---|---|---|---|---|---|---|---|---|---|---|
| i | $d_1$ | $d_2$ | $d_3$ | $d_4$ | $d_5$ | $b_1$ | $b_2$ | $b_3$ | $b_4$ | $b_5$ | $b_6$ | $b_7$ | $b_8$ | $b_8$ | $b_7$ | $b_6$ | $b_5$ | $b_4$ | $b_3$ | $b_2$ | $b_1$ | $b_0$ |
| 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| 1 | 0 | 0 | 0 | 0 | 1 | 1 | 1 | 0 | 0 | 0 | 0 | 0 | 0 | 0 | 0 | 0 | 0 | 1 | 1 | 0 | 0 | 1 |
| 2 | 0 | 0 | 0 | 1 | 0 | 0 | 0 | 1 | 1 | 0 | 0 | 0 | 0 | 0 | 0 | 0 | 1 | 0 | 1 | 0 | 1 | 1 |
| 3 | 0 | 0 | 0 | 1 | 1 | 0 | 0 | 0 | 0 | 1 | 0 | 0 | 1 | 0 | 0 | 0 | 1 | 1 | 0 | 0 | 1 | 0 |
| 4 | 0 | 0 | 1 | 0 | 0 | 0 | 0 | 0 | 0 | 0 | 1 | 1 | 0 | 0 | 0 | 1 | 0 | 0 | 1 | 1 | 1 | 1 |
| 5 | 0 | 0 | 1 | 0 | 1 | 1 | 1 | 1 | 1 | 0 | 0 | 0 | 0 | 0 | 0 | 1 | 0 | 1 | 0 | 1 | 1 | 0 |
| 6 | 0 | 0 | 1 | 1 | 0 | 1 | 1 | 0 | 0 | 1 | 0 | 0 | 1 | 0 | 0 | 1 | 1 | 0 | 0 | 1 | 0 | 0 |
| 7 | 0 | 0 | 1 | 1 | 1 | 1 | 1 | 0 | 0 | 0 | 1 | 1 | 0 | 0 | 0 | 1 | 1 | 1 | 1 | 1 | 0 | 1 |
| 8 | 0 | 1 | 0 | 0 | 0 | 0 | 0 | 1 | 1 | 1 | 0 | 0 | 1 | 0 | 1 | 0 | 0 | 0 | 0 | 1 | 1 | 1 |
| 9 | 0 | 1 | 0 | 0 | 1 | 0 | 0 | 1 | 1 | 0 | 1 | 1 | 0 | 0 | 1 | 0 | 0 | 1 | 1 | 1 | 1 | 0 |
| 10 | 0 | 1 | 0 | 1 | 0 | 0 | 0 | 0 | 0 | 1 | 1 | 1 | 1 | 0 | 1 | 0 | 1 | 0 | 1 | 1 | 0 | 0 |
| 11 | 0 | 1 | 0 | 1 | 1 | 1 | 1 | 1 | 1 | 1 | 0 | 0 | 1 | 0 | 1 | 0 | 1 | 1 | 0 | 1 | 0 | 1 |
| 12 | 0 | 1 | 1 | 0 | 0 | 1 | 1 | 1 | 1 | 0 | 1 | 1 | 0 | 0 | 1 | 1 | 0 | 0 | 1 | 0 | 0 | 0 |
| 13 | 0 | 1 | 1 | 0 | 1 | 1 | 1 | 0 | 0 | 1 | 1 | 1 | 1 | 0 | 1 | 1 | 0 | 1 | 0 | 0 | 0 | 1 |
| 14 | 0 | 1 | 1 | 1 | 0 | 0 | 0 | 1 | 1 | 1 | 1 | 1 | 1 | 0 | 1 | 1 | 1 | 0 | 0 | 0 | 1 | 1 |
| 15 | 0 | 1 | 1 | 1 | 1 | 1 | 1 | 1 | 1 | 1 | 1 | 1 | 0 | 0 | 1 | 1 | 1 | 1 | 1 | 0 | 1 | 0 |
| 16 | 1 | 0 | 0 | 0 | 0 | 1 | 0 | 1 | 0 | 0 | 0 | 0 | 1 | 1 | 0 | 0 | 0 | 0 | 1 | 1 | 1 | 0 |
| 17 | 1 | 0 | 0 | 0 | 1 | 0 | 1 | 0 | 1 | 1 | 0 | 0 | 0 | 1 | 0 | 0 | 0 | 1 | 0 | 1 | 1 | 1 |
| 18 | 1 | 0 | 0 | 1 | 0 | 0 | 1 | 1 | 0 | 0 | 0 | 1 | 0 | 1 | 0 | 0 | 1 | 0 | 0 | 1 | 0 | 1 |
| 19 | 1 | 0 | 0 | 1 | 1 | 1 | 0 | 0 | 1 | 0 | 1 | 0 | 0 | 1 | 0 | 0 | 1 | 1 | 1 | 1 | 0 | 0 |
| 20 | 1 | 0 | 1 | 0 | 0 | 1 | 0 | 0 | 0 | 1 | 0 | 1 | 0 | 1 | 0 | 1 | 0 | 0 | 0 | 0 | 0 | 1 |
| 21 | 1 | 0 | 1 | 0 | 1 | 0 | 1 | 0 | 0 | 0 | 1 | 0 | 1 | 1 | 0 | 1 | 0 | 1 | 1 | 0 | 0 | 0 |
| 22 | 1 | 0 | 1 | 1 | 0 | 0 | 0 | 1 | 0 | 1 | 1 | 0 | 0 | 1 | 0 | 1 | 1 | 0 | 1 | 0 | 1 | 0 |
| 23 | 1 | 0 | 1 | 1 | 1 | 0 | 0 | 0 | 1 | 0 | 0 | 1 | 1 | 1 | 0 | 1 | 1 | 1 | 0 | 0 | 1 | 1 |
| 24 | 1 | 1 | 0 | 0 | 0 | 1 | 1 | 0 | 1 | 1 | 0 | 0 | 0 | 1 | 1 | 0 | 0 | 0 | 1 | 0 | 0 | 1 |
| 25 | 1 | 1 | 0 | 0 | 1 | 1 | 1 | 0 | 1 | 0 | 0 | 1 | 1 | 1 | 1 | 0 | 0 | 1 | 0 | 0 | 0 | 0 |
| 26 | 1 | 1 | 0 | 1 | 0 | 1 | 0 | 1 | 1 | 1 | 0 | 1 | 0 | 1 | 1 | 0 | 1 | 0 | 0 | 0 | 1 | 0 |
| 27 | 1 | 1 | 0 | 1 | 1 | 1 | 0 | 1 | 1 | 0 | 1 | 0 | 1 | 1 | 1 | 0 | 1 | 1 | 1 | 0 | 1 | 1 |
| 28 | 1 | 1 | 1 | 0 | 0 | 0 | 1 | 1 | 0 | 1 | 0 | 1 | 1 | 1 | 1 | 1 | 0 | 0 | 0 | 1 | 1 | 0 |
| 29 | 1 | 1 | 1 | 0 | 1 | 1 | 0 | 0 | 1 | 1 | 0 | 1 | 1 | 1 | 1 | 0 | 1 | 1 | 1 | 1 | 1 | 1 |
| 30 | 1 | 1 | 1 | 1 | 0 | 1 | 0 | 1 | 0 | 0 | 1 | 1 | 1 | 1 | 1 | 1 | 0 | 1 | 1 | 0 | 0 | 1 |
| 31 | 1 | 1 | 1 | 1 | 1 | 0 | 1 | 0 | 1 | 1 | 1 | 1 | 0 | 1 | 1 | 1 | 1 | 1 | 0 | 1 | 0 | 0 |

The information rate of a code which provides error correction, is defined as the ratio of the number of bits representing information divided by the total number of bits. The group theoretic code in column $C_i$ represents distinct 5-bit information words, and requires eight bits per code vector. Therefore, the information rate is ⅝ or 0.625. The information rate of the linear systematic code of column $V_i$, where the leading five bits are information bits and the four trailing bits are check bits, is 5/9 or 0.556.

Every pair of distinct code vectors $C_i$ differ by a minimum of two bits from one another, while every pair of distinct vectors $V_i$ differ in three or more bits. However, the asymmetric code $C_i$ corrects only for single "1" to "0" transitions, rather than vice-versa, while the symmetric code $V_i$ corrects for single errors in either direction. By constructing the memory cells so that errors occur substantially only in one direction (only from "1" to "0" but not vice-versa), and by using an asymmetric error-correcting code which corrects for single errors in a direction from "1" to "0", applicant is able to greatly increase the information rate of the memory. The asymmetric code $C_i$ can be used to correct for a single asymmetric error by employing the following nine polynomials:

TABLE 2

| | | |
|---|---|---|
| $a_0 =$ | 0 | |
| $a_1 =$ | 1 | |
| $a_2 =$ | 2 | |
| $a_3 =$ | | x |
| $a_4 =$ | | 2x |
| $a_5 =$ | 1 + | x |
| $a_6 =$ | 2 + | x |
| $a_7 =$ | 1 + | 2x |
| $a_8 =$ | 2 + | 2x |

It may be noted that the integer power of x indicates the position of its coefficient in vector notation; for example, $2 + x$ represents the vector 2 1. A given 8-bit binary vector is a code vector (is a member of the group $C_i$) if and only if the following dot product consequence is true.

$$b_1a_1 + b_2a_2 + \ldots b_8a_8 \equiv a_0 \qquad \text{Eq. 1}$$

where $b_1$ through $b_8$ are given in Table 1 and $a_0$ through $a_8$ are given in Table 2. Only the modulo 3 sum of coefficients of like powers of x is used, that is, only the remainder after dividing by 3 is used, and this is indicated by three horizontal lines (in common nomenclature, the three horizontal lines are uniformly spaced in a vertical direction and are all of the same length). If the remainder equals $a_0$ (i.e., equals zero), then there is no detectable error. The difference between $a_0$ and the dot product sum reveals the position of the error. Two examples will help to show how the error correcting is accomplished.

EXAMPLE 1

Assume that $C_{22} = 00101100$ is stored, and that a transient error causes a change in bit $b_5$, so it becomes the erroneous word $C'_{22} = 00100100$. First the dot product is calculated, of 00100100 with vectors $a_1 \, a_2 \ldots a_8$ as follows:

$$\begin{aligned}0 \cdot a_1 &+ 0 \cdot a_2 + 1 \cdot a_3 + 0 \cdot a_4 + 0 \cdot a_5 \\ &+ 1 \cdot a_6 + 0 \cdot a_7 + 0 \cdot a_8 = a_3 + a_6 = x \\ &+ (2 + x) = 2 + 2x = a_8\end{aligned} \qquad \text{Eq. 2}$$

Since the dot product does not yield $a_0 = 0$, the vector $C'_{22}$ is erroneous. The location of the error is determined as follows:

$$a_0 - a_8 = 0 - (2 + 2x) = -2 - 2x \equiv 1 + x \bmod 3 = a_5 \qquad \text{Eq. 3}$$

where $\equiv$ represents the modulo 3 equivalent (e.g., $3 \equiv 0$ mod 3, $4 \equiv 1$ mod 3, $5 \equiv 2$ mod 3, $-1 \equiv 2$ mod 3, $-2 \equiv 1$ mod 3, and $-3 \equiv 0$ mod 3). The fact that $a_0 - a_8$ yields $a_5$ indicates that position $b_5$ is in error, so $C'_{22}$ can be corrected to $C_{22}$ by changing 00100100 to 00101100.

Another approach would be to compare the erroneous word $C'_{22}$ to each of the thirty-two words in Table I, and determine how many "0" bits in $C'_{22}$ have to be changed to equal each codeword in the table. Only codeword $C_{22}$ results from a single change of a "0" to a "1" in $C'_{22}$. However, this approach is costly in terms of time and memory.

EXAMPLE 2

Assume that $C_{10} = 00001111$ is stored, and a transient error causes a change in bit $b_7$, to produce erroneous codeword $C'_{10} = 00001101$. First find the dot product:

$$\begin{aligned}0 \cdot a_1 &+ 0 \cdot a_2 + 0 \cdot a_3 + 0 \cdot a_4 + 1 \cdot a_5 \\ &+ 1 \cdot a_6 + 0 \cdot a_7 + 0 \cdot a_8 = a_5 + a_6 + a_8 \\ &= (1 + x) + (2 + x) + (2 + 2x) = 5 + 4x \equiv 2 + x = a_6\end{aligned} \qquad \text{Eq. 4}$$

The location of the error is given by:

$$a_0 - a_6 = 0 - (2 + x) = -2 - x \equiv (1 + 2x) \bmod 3 = a_7 \qquad \text{Eq. 5}$$

This indicates that position $b_7$ is in error, so $C'_{10}$ can be corrected to $C_{10}$ by changing 00001101 to 00001111.

FIG. 3 is a plan view showing implementation of the memory cell of FIG. 2, as it appears on a silicon chip. In this diagram the areas are defined so that the area such as 40 within thick-lined borders is diffusion into the silicon. The area within dashed borders such as 42 represent a P well. The area within dotted borders such as 44 represents a P+ diffused region. The area within thin solid boarders such as 46 represents metal. The dotted areas such as 48 represent polysilicon. The solid areas such as 50 represent a contact. The drains such as 34, 36 of the transistors are diagonally hatched. It can be seen that the drain area 34 of transistor 20 has an area about twelve times as great as that of the drain 36 of transistor 26. The drain 34 is more likely to be hit by cosmic radiation, but its larger area and consequent higher capacitance makes it more resistant to change from such radiation. When the drain 34 receives sufficient radiation to short circuit it to the $V_{DD}$ line 54, it will readily change the state of the memory cell from "1" to "0". The drain 36 is much smaller and therefore less likely to be hit by cosmic radiation. When hit by cosmic radiation of only small to moderate linear energy transfer, the brief shorting of drain 36 to $V_{DD}$ is unlikely to be sufficient to overcome the capacitance of drain 34 to switch the memory cell from a "0" to a "1". Only radiation of very high linear energy transfer striking the small drain 36 can cause a switch in the memory state from "0" to "1", and such occurrences are very rare. Increasing the area of drain 34 to a plurality of times, such as twelve times the area of drain 36 does not greatly increase the area of the entire memory cell. The cells are each preferably at least two orders of magnitude more likely to be switched by ionizing radiation from a first state to a second state than vice versa. The improvement of the invention is also obtained when the length of each codeword is less than the ratio of the probability of erroneously switching from the first state to the second state, over the probability of a reverse switching.

FIG. 4 illustrates a memory system 60 which includes groups of memory cells such as groups 62, 64 that each contain eight memory cells that represent an 8-bit code vector of an asymmetric theoretic code. A coding circuit 66 which includes encoders and decoders, monitors the states of the cells 10a, 10b, etc. of the group 62 at intervals to determine whether there is an error, using the nine polynomials given in Table II above and the asymmetric code at $C_i$ in Table I, and following the method described above. Upon detecting an error, the circuit 66 changes the state of a corresponding one of the memory cells 10a-10h to correct the error. The lines 70 enable the circuit 66 to monitor the states of the cells, while lines 72, connected through gates (not shown), enable the circuit to change the states of cells. The figure also shows a circuit 74 for delivering information encoded by the asymmetric code to the groups of cells.

Thus, the invention provides a memory apparatus of the type which includes binary memory cells arranged in groups that each represent a codeword, and circuitry responsive to the bits of the codeword for correcting errors therein. An asymmetric code is used which is more sensitive to an error caused by a change in a memory cell state from a first state to a second than from the second state to the first, in that while it can detect either type of error it can only correct for one type of error ("1" to "0"). The particular circuitry described above detects which of the cells contains an erroneous "0", which may be caused by a previously stored "1" having been erroneously changed to a "0", and changes the state of the corresponding cell to the proper state. It is possible to use only an error detecting code instead of an error correcting code, to reduce the number of bits for each codeword, as in situations where it is only necessary to know that the codeword is in error rather than to correct it.

The above approach of constructing a cell which is asymmetric in that it is much more likely to switch from a first to a second state than vice versa, and an asymmetric error correcting code for correcting only for bits erroneously in the second state, is useful for various cells having memory functions. In addition to SRAM cells used only for string information, the approach can be used for latches and registers, and all of such cells with memory functions are herein referred to as "memory cells."

Although particular embodiments of the invention have been described and illustrated herein, it is recognized that modifications and variations may readily occur to those skilled in the art and consequently it is intended to cover such modifications and equivalents.

We claim:

1. A memory apparatus comprising:
   a memory which includes a plurality of binary memory cells, each memory cell including first and second regions that each can change the binary state of the cell when struck by ionizing radiation at a time when the region is at a predetermined voltage, and wherein said first region of each cell is a plurality of times larger than said second region;
   encoder means for storing a codeword in each of a predetermined group of said memory cells, with each codeword having a plurality of bits that can each have first and second states, and with the codewords being based on an asymmetric error correcting code which enables the correction of any single error in a codeword wherein a bit has erroneously changed from a first state to a second state;
   each binary cell being in said first state when said first region is at said predetermined voltage.

2. The apparatus described in claim 1 wherein:
   said code is of the type listed in Table I.

3. In the memory that includes groups of binary memory cells with each group forming a word, each cell being settable in first and second states, and that also includes means defining an error correcting code which can correct an error in the word defined by the plurality of cells, wherein each of said cells is capable of being erroneously switched between first and second of said binary states when hit in particular locations by ionizing radiation, the improvement wherein:
   said cells are each constructed to be a plurality of times more likely to be switched by ionizing radiation from said first state to said second state then from said second state to said first state; and
   said error correcting code is an asymmetric code which is more sensitive to an error caused by one of said cells erroneously being in said second state than by one of said cells erroneously being in said first state;
   each of said cells includes first and second inverters with each inverter including two transistors forming two sources and a drain, and including a voltage supply having first and second terminals with the terminals coupled to the sources of each inverter of a cell, said cell representing said first state when said first inverter drain is at substantially the voltage of said second terminal and said second inverter drain is at substantially the voltage of said first terminal, and said cell represents said second state when said first inverter drain is at substantially the voltage of said first terminal and said second inverter drain is at substantially the voltage of said first terminal;
   the drain of one of the transistors in one of said inverters of each cell having an area which is a plurality of timers larger than the area of the drain of a transistor of the other inverter of the cell.

* * * * *